United States Patent [19]

Sumi et al.

[11] Patent Number: 5,597,739

[45] Date of Patent: Jan. 28, 1997

[54] MOS TRANSISTOR AND METHOD FOR MAKING THE SAME

[75] Inventors: Hirofumi Sumi; Naoki Nagashima, both of Kanagawa, Japan

[73] Assignee: Sony Corporation, Tokyo, Japan

[21] Appl. No.: 636,848

[22] Filed: Apr. 23, 1996

Related U.S. Application Data

[63] Continuation of Ser. No. 372,243, Jan. 13, 1995, abandoned.

[30] Foreign Application Priority Data

Jan. 19, 1994 [JP] Japan ................................. 6-018991

[51] Int. Cl.⁶ ..................... H01L 21/265; H01L 21/20; H01L 21/44; H01L 21/302
[52] U.S. Cl. ................. 437/21; 437/62; 437/86; 437/200; 437/202
[58] Field of Search .............................. 437/20, 86, 200, 437/202, 974, 21, 62

[56] References Cited

U.S. PATENT DOCUMENTS

| | | | |
|---|---|---|---|
| 4,146,504 | 7/1979 | Hsu ........................................ | 257/352 |
| 5,066,613 | 11/1991 | Reedy et al. ............................ | 437/200 |
| 5,316,960 | 5/1994 | Watanabe et al. ...................... | 437/29 |
| 5,338,698 | 8/1994 | Subbanna ............................... | 437/200 |
| 5,407,837 | 4/1995 | Eklund .................................... | 437/200 |
| 5,449,642 | 9/1995 | Tan et al. ................................ | 437/200 |

OTHER PUBLICATIONS

Patent Abstracts of Japan –JP5226364 –3 Sep. 1993, vol. 17, No. 672.
Patent Abstracts of Japan –JP1286366 –vol.14, No. 67, May 12, 1988.
Patent Abstracts of Japan –JP5315355 –vol. 18, No. 116 –May 12, 1992.
Patent Abstracts of Japan –JP2090538 –vol. 14, No. 282 –Sep. 28, 1988.
Patent Abstracts of Japan –JP 61048975 –10 Mar. 1986 –vol. 10, No. 209.

Primary Examiner—John Niebling
Assistant Examiner—Brian K. Dutton
Attorney, Agent, or Firm—Hill, Steadman & Simpson

[57] ABSTRACT

Transistor devices comprise a gate electrode, a channel region formed beneath the gate electrode, a source region in contact with one side of the channel region, a first conductive region formed in a semiconductor layer at the outer side of the source region and made of a metal or metal compound, a drain region formed in contact with the other side of the channel region, and a second conductive region formed in the semiconductor layer at the outer side of the drain region and consisting of a metal or a metal compound. The transistor has an SOI structure which has an improved breakdown voltage between the source region and the drain region with low sheet resistances of the source and drain regions. Methods for making the transistor devices are also described.

11 Claims, 12 Drawing Sheets

F I G. 5A
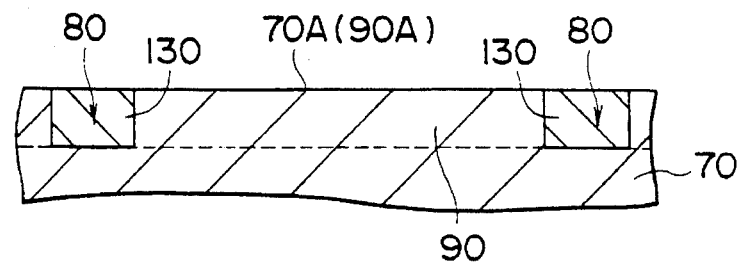
F I G. 5B
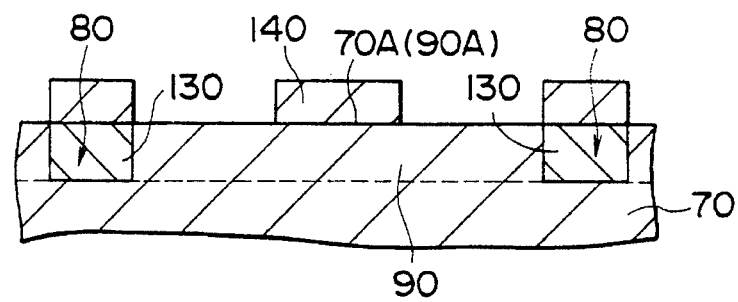
F I G. 5C
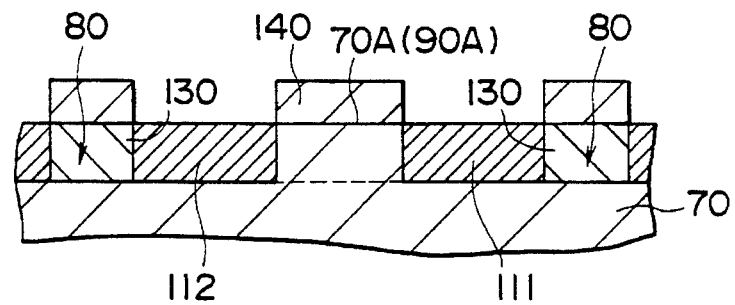

5,597,739

MOS TRANSISTOR AND METHOD FOR MAKING THE SAME

This is a continuation of application Ser. No. 08/372,243, filed Jan. 13, 1995 now abandoned.

BACKGROUND OF THE INVENTION

This invention relates to a transistor device and more particularly, to a MOS transistor device and a method for making such a device.

As semiconductor devices are highly integrated, the fineness in the dimensional ruling of the semiconductor manufacturing processes has become a problem. In fact, in element isolation techniques, the conventional LOCOS method cannot cope with the problem of the fineness with the influence of the birds beak. Hence, attention has been paid to SOI (semiconductor on insulator) techniques for element isolation in semiconductor devices of the 0.1 μm ruling type. The transistor devices made by use of the SOI technique are highly resistant to α rays. Moreover, the above semiconductor device does not produce any parasitic capacitance between the source-drain region and the semiconductor substrate as will be undesirably involved in a transistor device which is made using a bulk semiconductor substrate, so that the high working speed of the transistor device is insured. Thus, with the transistor device using the SOI technique, high reliability and high working speed can be attained.

Reference is now made to FIGS. 1A to 1F, with which a method of making a MOS transistor using the known SOI technique is described.

[Step-10]

Initially, a first semiconductor substrate 10 made of silicon is provided, and grooves 20 are formed on one side 10A of the substrate 10 (FIG. 1A).

[Step-20]

Then, an insulating layer 21 made of silicon dioxide is deposited in the grooves 20 and on the one side 10A of the first semiconductor substrate 10. Thereafter, a polysilicon layer 22 is further deposited on the insulating layer 21, followed by smoothing the surface of the polysilicon layer 22 (FIG. 1B).

[Step-30]

Subsequently, the polysilicon layer 22 formed on one side 10A of the first semiconductor substrate 10 and a second semiconductor substrate 11 made of silicon are bonded together (FIG. 1C).

[Step-40]

The first semiconductor substrate 10 is polished at the other side 10B thereof until the grooves 20 are exposed at respective bottoms 20A thereof (FIG. 1D). By this, a semiconductor layer 30 made of silicon is exposed between the adjacent grooves 20. The respective semiconductor layers 30 are electrically isolated with the grooves 20 and the insulating layers 21. It will be noted that the semiconductor layers 30 are formed of the first semiconductor substrate 10.

[Step-50]

Then, a gate electrode region 41, gate side walls 44, a channel region 45, a source region 46 and a drain region 47 are formed on the semiconductor layer 30 according to any known procedure (FIG. 1E). In this manner, a MOS transistor is made. Next, a layer insulating layer 60 is formed entirely thereover, after which openings 61 are respectively formed at regions corresponding to the source region 46 and the drain region 47 (FIG. 1F), thereby forming contact holes.

As the MOS transistor having an SOI structure is made finer, it is necessary to make the semiconductor layer 30 smaller in thickness. If the semiconductor layer 30 is not made thinner according to the fineness of the dimensional rule, there arise the problem of degradation of the breakdown voltage between the source and drain regions and the problem on the short channel effect.

With the MOS transistor having an SOI structure, the source region 46, channel region 45 and drain region 47 are formed on the insulating layer 21. Therefore, when the transistor device is in a pinch-off state where holes or electrons move through the semiconductor layer 30, the high electric field is accelerated at the end of the drain region, so that holes or electrons are impact-ionized, thereby generating electron-hole pairs. Either of the thus generated electrons or holes are accumulated in the semiconductor layer 30 (particularly, in the channel region 45). This eventually lowers the breakdown voltage between the source and drain regions. It will be noted that with ordinary MOS transistors, a well is grounded through the semiconductor substrate, so that such problems as set out above are not produced at all.

One of the attempts for solving the above problem is a technique wherein a silicide layer is formed on the surface of the source and drain regions and carriers accumulated in the channel region are grounded through the silicide layer as set out, for example, in "Suppression of Latch in SOI MOSFETs by Silicidation of Source", L. J. McDAID, et al., Electronics Letters, 23rd May 1991, vol. 27, No. 11, pp. 1003–1005. The carriers accumulated in the channel region are not completely grounded, and an improvement in the breakdown voltage between the source and drain regions is not satisfactory.

With the dimensional ruling of 0.5 μm, it has been generally accepted that the required thickness of the semiconductor layer 30 is 100 nm. With the dimensional ruling of 0.35 μm, the required thickness of the semiconductor layer 30 is about 70 nm. As the thickness of the semiconductor layer 30 is made smaller in this way, there arises the problem that the sheet resistances of the source region 46 and the drain region 47 increase. For instance, when the thickness of the semiconductor layer 30 is about 100 nm, the sheet resistance is approximately 70Ω/□. When the thickness of the semiconductor layer 30 is about 70 nm, the sheet resistance increase up to not-lower than 100Ω/□. The thickness of the semiconductor layer 30 will further become thinner in the future, with the attendant problem that the sheet resistance of the source 46 and the drain 47 increases more and more. By the increase of the sheet resistance, the parasitic resistance of the transistor device increases, resulting in the degradation of the device characteristics.

On the other hand, when the semiconductor layer 30 is made thinner, the semiconductor layer 30 may be fully lost by 1aover-etching on formation of the openings 61 through anisotropic dry etching of the insulating layer. In addition, there is another problem that the area of contact between the contact hole and the semiconductor layer 30 is lessened, thereby increasing the contact resistance.

Moreover, when the semiconductor layer 30 is made thin, the peak of the electric field at the drain region becomes high. For the transistor devices having an SOI structure, this results in degradation of the device and also in characteristic degradation, such as of a parasitic bipolar effect.

OBJECT AND SUMMARY OF THE INVENTION

An object of the invention is to provide a transistor device having SOI structure wherein the breakdown voltage between its source and drain regions can be improved and wherein when a semiconductor layer on which a channel region, a source region and a drain region are to be formed is made thin according to the fineness of the dimensional rule, the sheet resistances of the source and drain regions can be suppressed.

In order to achieve the above object, the transistor device of the invention is of the type, as shown in FIG. 2, which comprises an insulating layer 81 and a semiconductor layer 90 formed on the insulating layer 81, and a channel region 105, a source region 106 and a drain region 107 formed on the semiconductor layer 90, characterized by;

(a) a gate electrode 101;

(b) a channel region 105 formed beneath the gate electrode 41;

(c) a source region 106 formed in contact with one of the channel region 105;

(d) a first conductive region 111 formed on the semiconductor layer at the outer side of the source 106 and consisting of a metal or metal compound;

(e) a drain region 107 formed in contact with the other side of the channel region 105; and (f) a second conductive region 112 formed on the semiconductor layer at the outer side of the drain region 47 and formed of a metal or metal compound.

The transistor device of the invention has gate side walls 44 at opposite sides of the gate electrode and formed of an insulating material, and a structure such that the source region 46 and the drain region 47 are covered with the gate side walls 44, respectively.

Further, as schematically shown in the partial section of FIG. 6, the transistor device of the invention has a structure such that a region of a semiconductor layer 90 on which a channel region 105 is formed is thinner than regions of the semiconductor layer 30 on which a source region 106 and a drain region 47 are formed.

The metal compounds include, for example, silicides such as titanium silicide and the metal includes, for example, tungsten.

In order to achieve the above object, there is provided a method for making a transistor device of the first embodiment wherein a gate electrode region, a channel region, a source region and a drain region are formed on a semiconductor layer formed on an insulating layer, the method comprising the steps of:

(a) forming an insulating layer on one side of a semiconductor layer;

(b) forming a gate electrode region on the other side of the semiconductor layer;

(c) forming a source region and a drain region in the semiconductor layer to form a channel region beneath the gate electrode region of the semiconductor region; and (d) forming a first conductive region at the outer side of the source region and formed of a metal or metal compound and forming a second conductive region formed at the outer side of the drain region and formed of a metal or metal compound.

Another method for making a transistor device having a gate electrode region, a channel region, a source region and a drain region in a semiconductor layer formed on an insulating layer, the method comprising the steps of:

(a) forming a first conductive region formed of a metal or metal compound in a region outside a region of a semiconductor layer in which a source region is to be formed and forming a second conductive region formed of a metal or metal compound in a region outside a region of the semiconductor layer in which a drain region is to be formed;

(b) forming an insulating layer on one side of the semiconductor layer;

(c) forming a gate electrode region on the other side of the semiconductor layer; and (d) forming a source region and a drain region in the semiconductor layer to form a channel region beneath the gate electrode region of the semiconductor layer.

In the step between the steps (c) and (d) of these manufacturing methods of the invention, there may be included the step of forming gate side walls at the sides of the gate electrode region and formed of an insulating material. In the step of forming the insulating layer on one side of the semiconductor layer, the thickness of the semiconductor layer on which the channel region is to be formed can be made smaller than the thickness of the semiconductor layer on which the source region and the drain region are to be formed.

In the methods of making the transistor device, the first and second conductive regions are each made of a metal and the regions of the semiconductor layer in which the first and second conductive regions are to be formed may be entirely substituted with the metal. In this case, the regions of the semiconductor layer which are to be formed with the first and second conductive regions may be entirely substituted according to a CVD method. The metal should preferably be formed of tungsten.

Alternatively, the first and second conductive regions may be formed of a metal compound. One or the other side of the semiconductor layer on which the first and second conductive regions are to be formed is formed with a metallic layer, after which the metallic layer and the semiconductor layer are reacted with each other to form the metal compound. In the case, this metallic layer is composed of a transition metal or a noble metal. The reaction between the metallic layer and the semiconductor layer can be carried out by (A) a thermal treatment step wherein the metallic layer and the semiconductor layer are reacted at such a temperature that the oxide of the atom of the semiconductor layer and the transition metal or noble metal of the metal layer are not reacted, and (B) the unreacted metal compound is removed. The metal compound includes, for example, a silicide such as titanium silicide.

In the transistor device of the invention, the first and second conductive regions 51 and 52 are formed at the outer sides of the source region 46 and the drain region 47, respectively. Accordingly, when the device is in an "on" state where the holes or electrons move through the semiconductor layer 30, the silicon atoms in the region where the holes or electrons move are ionized. The ionized atoms are absorbed in the first and second conductive regions 51 and 52 from the channel region 45 through the source region 46 and the drain region 47, and are not accumulated in the channel region 45. As a consequence, the problem of degrading the breakdown voltage between the source region and the drain region can be avoided. Since the first and second conductive regions 51, 52 are formed, the increase in the sheet resistance of the source region 46 and the drain region 47 can be prevented, even if the semiconductor layer 30 is made thin.

It will be noted that if the thickness at the region of the semiconductor layer 30 in which the channel region 45 is formed is smaller than that at the regions of the semiconductor layer 30 in which the source region 46 and the drain region 47 have been formed, the banishment of the semiconductor layer through dry etching at the time of the formation of contact holes can be prevented, thereby preventing the increase in contact resistance.

BRIEF DESCRIPTION OF THE DRAWINGS

FIGS. 5A to 5C are, respectively, schematic views, partially in section, of a series of steps for illustrating a method for making a MOS transistor using an SOI technique according to a fifth embodiment of the invention;

DETAILED DESCRIPTION OF THE PREFERRED EMBODIMENTS

Figure 1A:
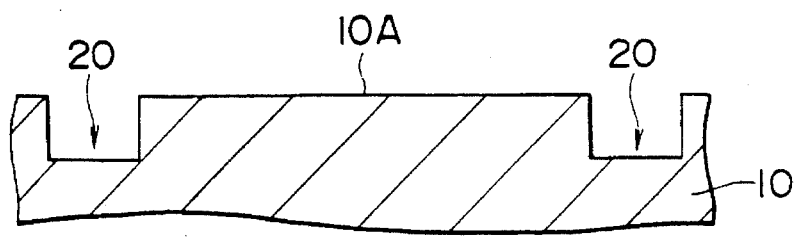
FIGS. 1A to 1F are, respectively, a schematic view, partially in section, of a semiconductor for illustrating a method for a MOS transistor according to a prior art SOI technique.
Figure 1B:
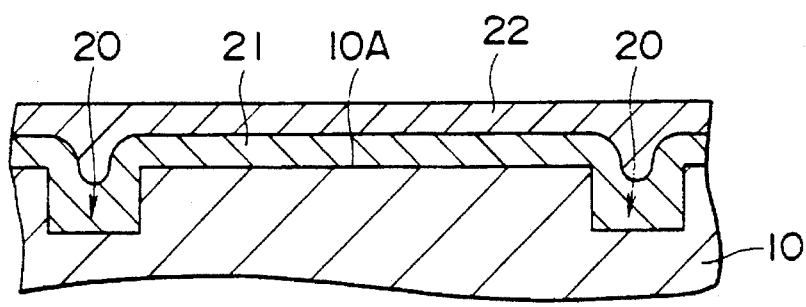
Figure 1C:
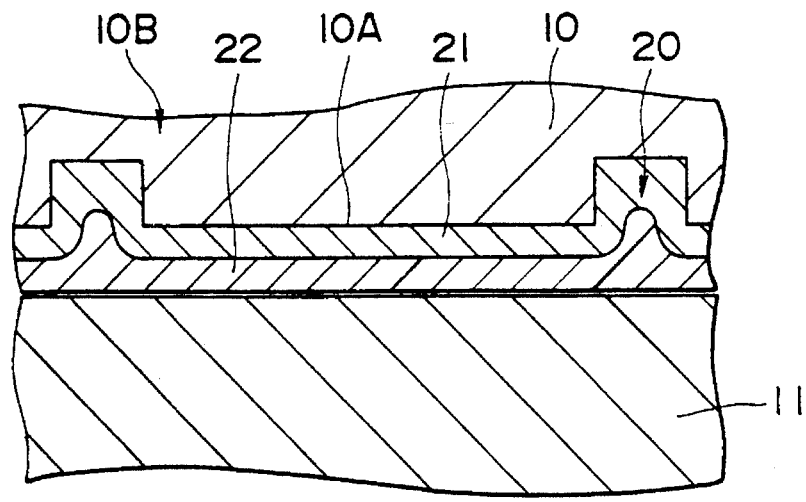
Figure 1D:
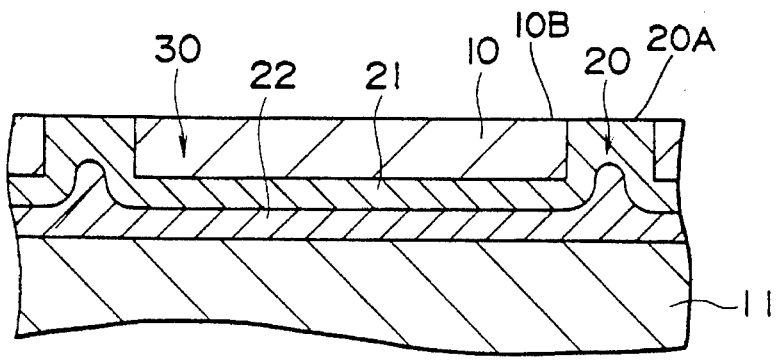
Figure 1E:
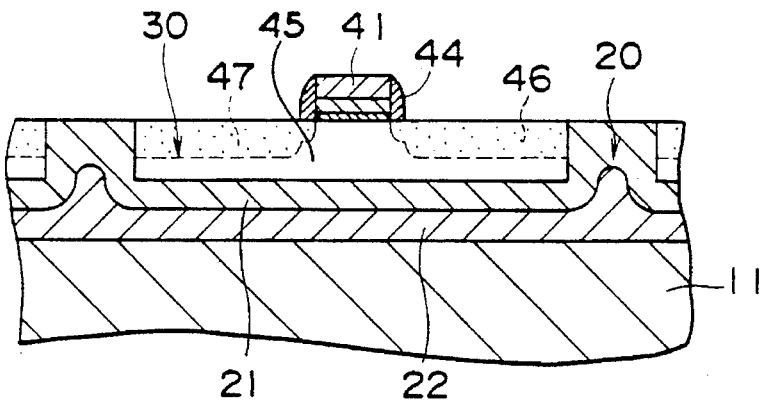
Figure 1F:
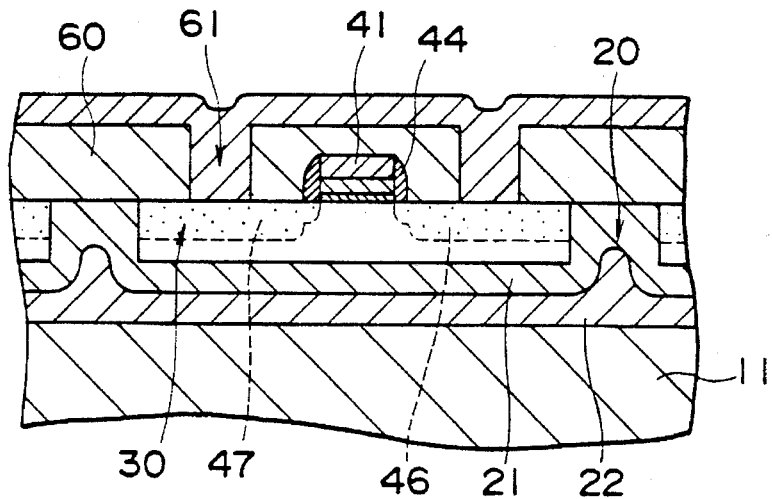

Reference is now made to the accompanying drawings wherein embodiments of the invention are described and like reference numerals indicate like parts or members, unless otherwise indicated. In these embodiments, a MOS transistor is illustrated as a transistor device. It will be noted that Examples 2 and 3 illustrate a method for making a transistor device according to the first embodiment of the invention, and Examples 4 and 5 illustrate a method for making a transistor device according to a second embodiment of the invention. Moreover, Example 6 relates to a transistor device having a structure such that the thickness of a semiconductor layer having a region wherein a channel region is formed is smaller than that of the semiconductor layer at regions where source and drain regions are formed.

Figure 2:
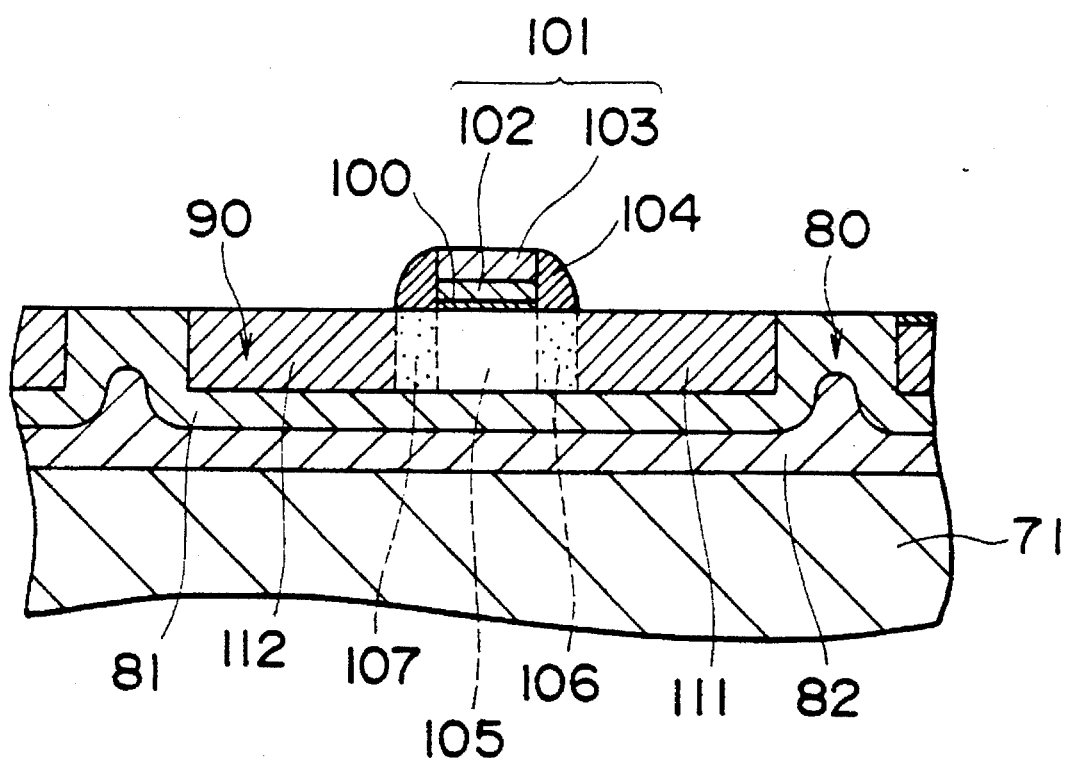
FIG. 2 is a sectional view of a structure of a MOS transistor using an SOI technique according to one embodiment of the invention.

The transistor device according to the first embodiment, i.e. Example 1, of the invention, is schematically shown, partially in section, in FIG. 2 which illustrates a MOS transistor having an SOI structure wherein a channel region 105, a source region 106 and a drain region 107 are formed on a semiconductor layer 90 formed on an insulating layer 81. A gate electrode region 101 is formed on the semiconductor layer 90. The channel region 105 is formed beneath the gate electrode region 101. The source region 106 is formed in contact with one side of the channel region 105 and the drain region 107 is formed in the other side of the channel region 105.

The most important feature of the transistor of the invention resides in the formation of a first conductive region 111 formed at the outer side of the source region 106 of the semiconductor layer 90 and formed of a metal or a metal compound and a second conductive region 112 formed at the outer side of the drain region 107 and formed of a metal or metal compound. The first and second conductive regions 111, 112 in Example 1 are, respectively, formed of a silicide compound, preferably titanium silicide ($TiSi_2$).

In Example 1, gate side walls 104 are, respectively, formed on side walls of the gate electrode region 101 and made of an insulating material such as, for Example, $SiO_2$. The gate side walls 104, respectively, cover the source region 106 and the drain region 107 therewith.

The transistor device of Example 1 is made according to a method for making a transistor device of the invention. The method may comprise forming the gate side walls made of an insulating material on side walls of the gate electrode region 101.

The first conductive region 111 and the second conductive region 1 each formed of a metal compound such as titanium silicide ($TiSi_2$) are, respectively, formed by forming a metallic layer 110 such as, for Example, of titanium (Ti) on a side of the semiconductor layer 90 opposite to a side where the first and second conductive regions are to be formed, after which the metallic layer 110 and the semiconductor layer 90 made, for example, of Si are reacted.

Reference is now made to FIGS. 3A to 3I to illustrate the method for making a transistor device of Example 2 of the invention.

[Step-100] Formation of Insulating Layer

Figure 3A:
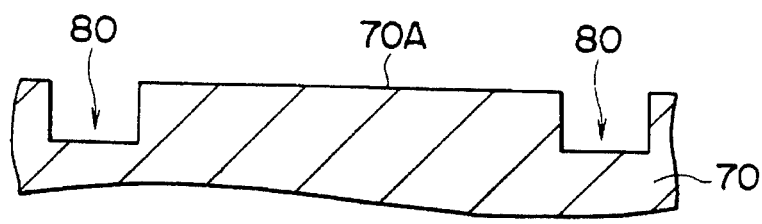
FIGS. 3A to 3I are, respectively, schematic views, partially in section, of a series of steps for illustrating a method for making a MOS transistor using an SOI technique according to the second and third embodiments of the invention.

Initially, an insulating layer 81 is formed on one side of the semiconductor layer 90. More particularly, a first semiconductor substrate 70 made of Si and having a Miller index of (100) is provided. A resist is applied onto one side 70A of the first semiconductor substrate 70 and dried, followed by patterning according to a lithographic technique. The first semiconductor substrate 70 is subjected to dry etching through the thus patterned resist as a mask to form grooves 80 in the one side 80A of the first semiconductor substrate 70, followed by removal of the resist. Thus, a structure as shown in FIG. 3A is obtained. The etching conditions of the first semiconductor substrate are, for example, those shown below.

Gases used: $SiCl_4/N_2$=10/10 sccm

Pressure: 1.3 Pa.

Microwave power: 850 W

RF power: 200 W

Subsequently, an insulating layer 81 formed of $SiO_2$ is deposited over the one side 70A of the first semiconductor substrate 70, including the grooves 80 according to the CVD method. The deposition conditions of the insulating layer 81 are those shown below.

Gases used: $SiH_4/O_2$=100/1000 sccm, $N_2$=30 slm

Temperature: 420° C.

Pressure: 13 Pa.

Film thickness: 0.4 μm

A polysilicon layer 82 is deposited on the insulating layer 81 according to the LP-CVD method under conditions mentioned below, for example.

Gases used: $SiH_4/H_2/N_2$=100/400/200 sccm

Temperature: 610° C.

Pressure: 70 Pa.

Film thickness: 0.2 μm

Figure 3B:
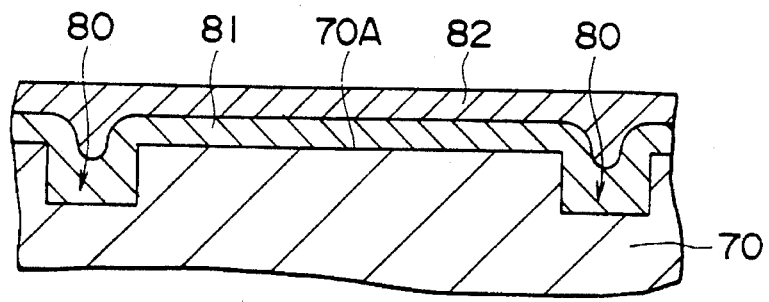

Then, a resist is applied on the surface of the polysilicon layer 82 and is entirely etched back to smooth the polysilicon layer (FIG. 3B). The etching-back conditions are, for example, those shown below.

Gases used: Ca$_2$Cl$_3$F$_3$/SF$_6$=60/10 sccm

Pressure: 1.3 Pa.

Microwave power: 850 W

RF power: 150 W

Figure 3C:
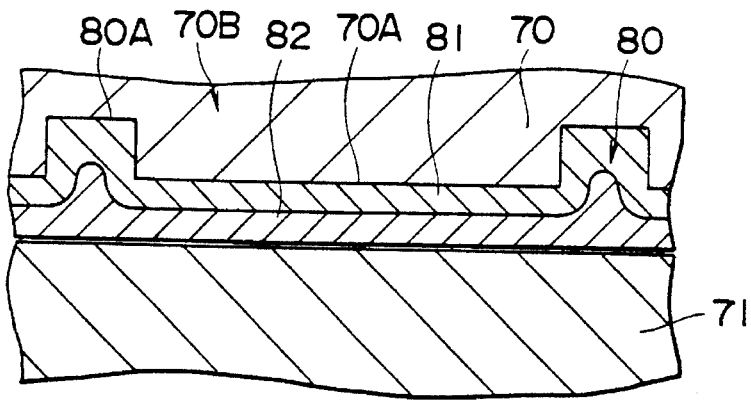

Thereafter, the polysilicon layer 82 is polished on the surface thereof and the thus polished polysilicon layer 82 is bonded with a second semiconductor substrate 71 made of silicon (FIG. 3C). The bonding is effected by subjecting the first and second semiconductor substrates 70, 71 in a superimposed condition to thermal treatment under conditions, for example, of 1100° C.×30 minutes.

Figure 3D:
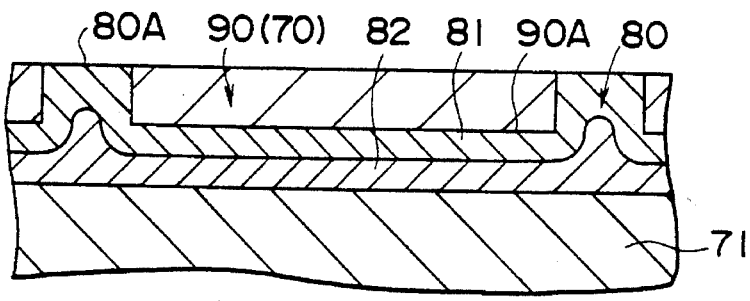

The first semiconductor substrate 70 is polished from the opposite side 70B thereof until a semiconductor layer 90 forming of silicon (i.e. the silicon of the first semiconductor substrate 70) and provided between any adjacent grooves 80 is exposed (FIG. 3D). When polished to bottoms 80A of the individual grooves 80, the insulating layers 81 made of SiO$_2$ and formed in the grooves 80 are exposed. SiO$_2$ is harder than Si, so that SiO$_2$ serves as a kind of polishing stopper, thereby preventing over-polishing of the silicon layer 90. In this manner, the insulating layer 81 is formed on one side 90A of the semiconductor layer 90 to provide a substrate having an SIO structure.

[Step-110] Formation of Gate Electrode Region

Figure 3E:
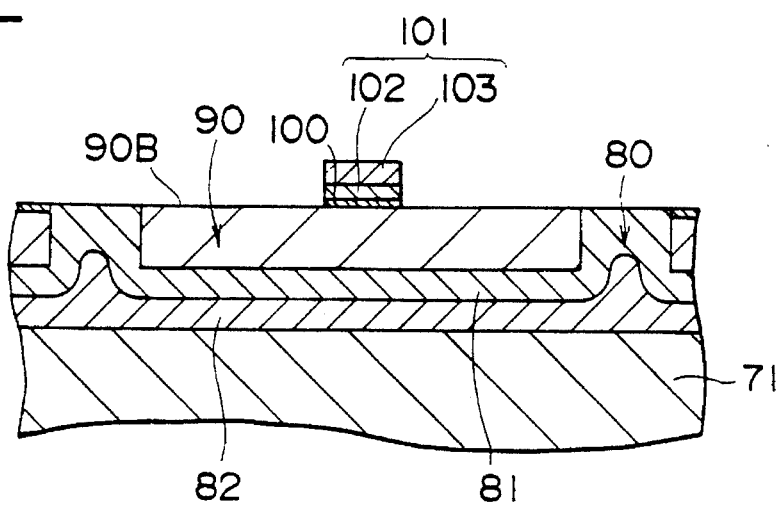

Subsequently, a gate electrode region 101 is formed on the other side 90B of the semiconductor layer 90 (FIG. 3E). To this end, a gate oxide film 100 made of SiO$_2$ is formed on the other side 90B of the semiconductor layer 90 using any known method. Next, a polysilicon film 102 (DOPOS) doped with boron is deposited on the gate oxide film 100 according to the CVD method. The polysilicon film 102 can be formed, for example, under the following conditions.

Gases used: SiH$_4$/PH$_3$/He=500/0.35/500 sccm

Temperature: 580° C.

Pressure: 80 Pa.

Film thickness: 0.15 μm

Then, a WSi$_2$ film 103 is formed on the polysilicon film 102 according to the CVD method. The WSi$_2$ film 103 can be formed, for example, under the following conditions.

Gases used: WF$_6$/SiH$_4$/He=10/1000/360 sccm

Temperature: 360° C.

Pressure: 27 Pa.

Film thickness: 0.15 μm

A resist is then applied onto the WSi$_2$ layer 103 and patterned, followed by dry etching to etch the WSi$_2$ layer 103 and the polysilicon film 102, for example, under the following conditions and removal of the resist. By this, the gate electrode region 102 is formed as having the gate oxide film 100, polysilicon film 102 and WSi$_2$ layer 103 (FIG. 3E).

Gases used: C$_2$Cl$_2$F$_3$/SF$_6$=65/5 sccm

Pressure: 1.3 Pa

Microwave power: 700 W

RF power: 100 W

[Step-120] Formation of Source and Drain Regions

Figure 3F:
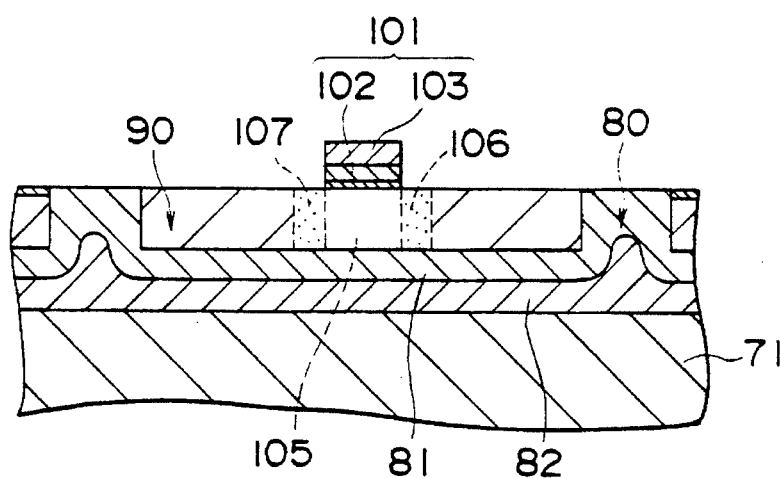

A source region 106 and a drain region 107 are, respectively, form in the semiconductor layer 90 thereby forming a channel region 105 in the semiconductor layer 90 beneath the gate electrode region 101. More particularly, a resist mask is first formed and an n-type or a p-type source region 106/drain region 107 are formed, for example, according to an ion implantation method (FIG. 3F). The ion implanting conditions are those, for example, shown below.

Formation of an n-type source region and a drain region

Ions: As

Dosage: 5×10$^{14}$/cm$^2$

Acceleration voltage: 30 KeV

Formation of p-type source region and drain region

Ions: BF$_2$

Dosage: 1×10$^{14}$/cm$^2$

Acceleration voltage: 30 KeV

[Step-130] Formation of Gate Side Walls

Figure 3G:
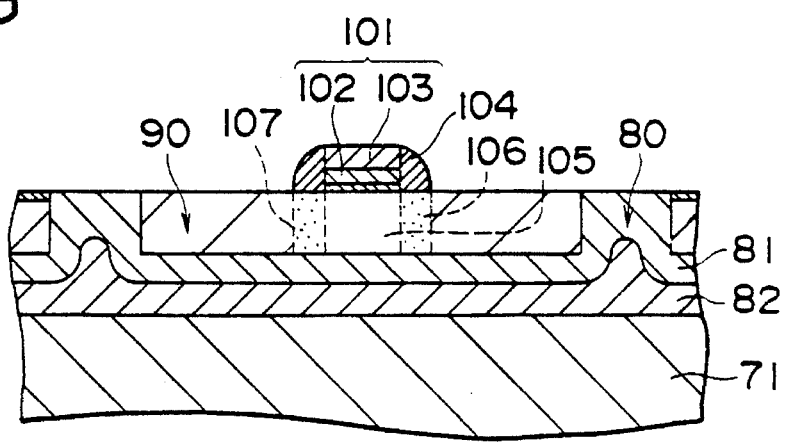

Gate side walls 104 formed of an insulating material are formed at side walls of the gate electrode region 101 (FIG. 3G). More particularly, a layer of an insulating material is deposited on the entire surface according to the CVD method using the following conditions.

Gases used: SiH$_4$/O$_2$/N$_2$=250/250/100 sccm

Temperature: 420° C.

Film thickness: 0.35 μm

Then, the insulating layer is subjected to anisotropic dry etching to form the gate side walls 104 made of the insulating material. The dry etching conditions are those, for example, set out below.

Gases used: C$_4$F$_8$=50 sccm

Pressure: 2 Pa

RF power: 1200 W

Thus, in Example 2, the source region 106 and the drain region 107 are covered with the gate side walls 104, respectively. In this state, the semiconductor layer 90 is exposed only at regions between the gate side walls 104 and the grooves 80. In these regions, first and second conductive regions are formed in a subsequent step.

[Step-140] Formation of First and Second Conductive Regions

In this step, a first conductive region 111 made of a metal compound is formed at the outside of the source region 106 of the semiconductor layer 90, and a second conductive region made of a metal compound is also formed at the outside of the drain region 107 of the semiconductor layer 90. For this purpose, a metallic layer 110 is formed on the other side 90B of the semiconductor layer 90 on which the first and second conductive regions are to be formed in Example 2, followed by reaction between the metallic layer 110 and the semiconductor layer 90. The metallic layer 110 is formed of titanium and the first and second conductive regions are made of titanium silicide (TiSi$_2$), respectively.

Figure 3H:
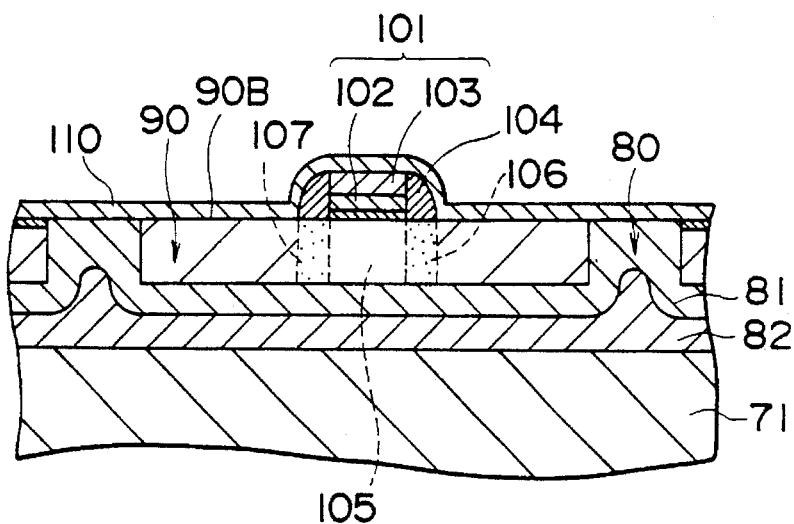

More particularly, a metallic layer 110 made of titanium is deposited over the entire surface of the side 90B by sputtering (FIG. 3H). The thickness of the metallic layer 110 is one which is sufficient to react with all the silicon atoms corresponding to the thickness of the semiconductor layer 90 made of silicon. For instance, the 60 nm thick Ti metallic layer 110 can be formed, for example, under the following film-forming conditions.

Gas used: Ar=100 sccm

Pressure: 0.47 Pa.

DC power: 4 kW

The metallic layer 110 made of Ti and the semiconductor layer 90 made of silicon are reacted to provide a metal compound (i.e. titanium silicide (TiSi$_2$)). The regions of the semiconductor layer 90 which react with the metallic layer 110 are those regions which are sandwiched between the gate side walls 104 and the grooves 80. In these regions, the first and second conductive regions are formed as shown. The reaction between the metallic layer 110 and the semiconductor layer 90 is carried out in the following manner.

The metallic layer 110 and the semiconductor layer 90 are reacted with each other at such temperatures at which the constituent atoms in the semiconductor layer 90 (i.e. Si atoms) and the constituent transition metal of the metallic layer (i.e. Ti) react with each other, but the oxide of the atoms (Si) in the semiconductor layer 90 (i.e. $SiO_2$) and the transition metal of the metallic layer 110 do not react at all. This reaction is called herein a thermal treatment. More particularly, the thermal treatment is effected in nitrogen gas under conditions of 600° C.×30 seconds. By this, $TiSi_x$ is produced.

Then, an unreacted metallic layer is removed by immersion, for example, in an ammoniated hydrogen peroxide aqueous solution (an aqueous mixed solution of $NH_4OH$ and $H_2O_2$) for approximately 10 minutes. The unreacted metallic layer is a metallic layer deposited on the grooves 80, gate side walls 104, and gate electrode region 101. Thus, the first conductive region 111 of the semiconductor layer 90 and made of the metal compound is formed at the outer side of the source region 106; the second conductive region 112 of the semiconductor layer 90 and mode of the metal compound is formed at the outer side of the drain region 107.

The thus removed substrate is subjected to second thermal treatment in an atmosphere of Ar under conditions of 800° C.×30 seconds to convert the $TiSi_x$ into $TiSi_2$. Thus, a transistor device shown in FIG. 2 is made.

[Step-150] Formation of Layer Insulating Layer and Openings

The layer insulating layer 120 formed of $SiO_2$ is deposited over the entire surface according to the CVD method using, for example, the following conditions—

Gas used: TEOS=50 sccm
Temperature: 720° C.
Film thickness: 0.6 μm

Next, openings 121 are formed in the insulating layer 120 above the source region 106 and the drain region 107. The anisotropic etching conditions for the insulating layer 120 are those, for example, indicated below—

Gas used: $C_4F_8$=50 sccm
Pressure: 2 Pa.
RF power: 1200 W

[Step-160]

Figure 3I:
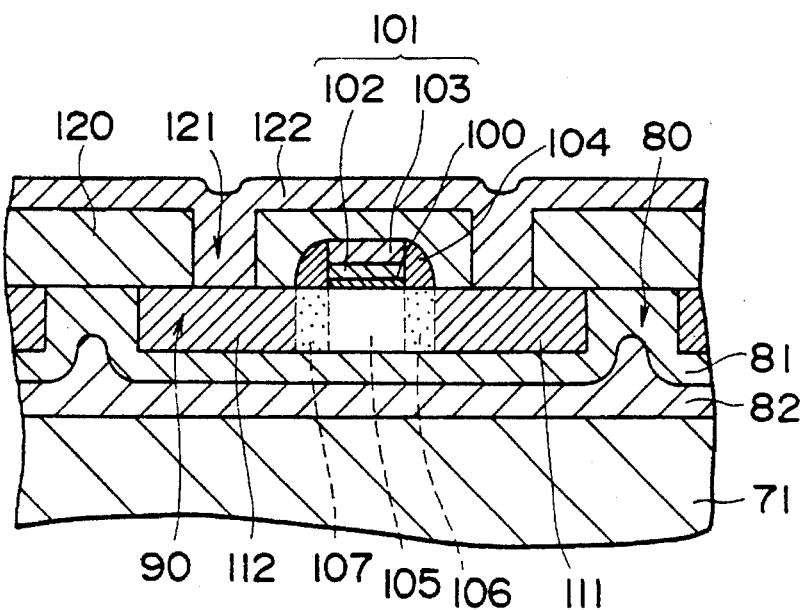

A metallic interconnection layer 122 is deposited over the insulating layer 120, including the openings 121 (FIG. 3I). It will be noted that in Example 2, tungsten is embedded in the respective openings 121 by a so-called blanket tungsten CVD method. A metallic interconnection material composed of an Al alloy is deposited over the insulating layer 120. It should be noted that in FIG. 3I, interconnection layers are not shown.

More particularly, prior to the embedding of tungsten into the openings 121, a contact layer made of Ti and a barrier metal layer made of TiN are formed on the insulating layer 120, including the openings 121, for example, by sputtering. The contact layer is formed for the purpose of reducing the contact resistance between the tungsten embedded in the openings 121 and the source region 106 or the drain region 107. The metal barrier layer is formed in order to prevent the tungsten embedded in the opening from reacting with the source region 106 or the drain region 107. Thereafter, tungsten is deposited over the entire surface according to the blanket tungsten CVD method, followed by removing the tungsten deposited on the insulating layer 120 by etching back.

Forming Conditions of the Contact Layer,
Gas used: Ar=100 sccm
Temperature: 150° C.
Film thickness: 30 nm
Pressure: 0.47 Pa.
Power: 4 kW Forming Conditions of the Barrier Metal Layer,
Gases used: $N_2$/Ar=70/40 sccm
Temperature: 150° C.
Film thickness: 70 nm
Pressure: 0.47 Pa.
Power: 5 kW Conditions of Blanket Tungsten CVD Method
Gases used: $WF_6/H_2/N_2$/Ar=75/500/300/2200 sccm
Temperature: 450° C.
Pressure: $1.1 \times 10^4$ Pa.
Film thickness: 0.4 μm Etching-back Conditions of Tungsten
Gas used: $SF_6$=50 sccm
Pressure: 1.3 Pa.
RF power: 150 W Then, a Ti layer is formed on the entire surface according to a sputtering method, on which a metallic interconnection material such as, for example, Al-Si (1%) is deposited by sputtering. The TI layer is formed in order to improve adhesion between the metallic interconnection material and the insulating layer 120. Subsequently, the metallic interconnection material and the Ti layer are etched as desired to form an upper interconnection layer having a desired pattern on the insulating layer 120. The upper interconnection layer including the metallic interconnection material and the Ti layer is electrically connected to the source region 106 and the drain region 107 through the openings 121 (i.e. contact holes) embedded with tungsten.

Forming Conditions of the Ti Layer—
Gas used: Ar=100 sccm
Temperature: 150° C.
Film thickness: 30 nm
Pressure: 0.47 Pa.
Power: 4 kW Forming Conditions of the Al-Si Metallic Interconnection Layer—
Gas used: Ar=40 sccm
Temperature: 300° C.
Film thickness: 0.5 μm
Pressure: 0.47 Pa.
Power: 22.5 kW Etching Conditions of the Al-Si/Ti Layers—
Gases used: $BCl_3/Cl_2$=60/90 sccm
Pressure: 0.016 Pa
Microwave Power: 1000 W
RF power: 50 W Example 3, i.e. the third embodiment, of the invention is described. In Example 2 set out hereinabove, the first and second conductive regions 111, 112 are formed of titanium silicide. In Example 3, the first and second conductive regions 111, 112 are each formed of a metal (e.g. tungsten). In this embodiment, the gate side walls 104 of an insulating material (e.g. $SiO_2$) are formed at the side walls of the gate electrode region 101 to cover the source region 106 and the drain region 107 therewith, like the embodiment of Example 2.

The transistor device of Example 3 can be made according to the method for making a transistor device explained with respect to the first embodiment of the invention. In this embodiment, the manufacturing method should comprise the step of forming the gate side walls 104 made of an insulating material at side walls of the gate electrode region 101 as well as other essential steps.

The difference between the method for making a transistor device in the Example 3 and the method set out in Example 2 resides in that the first and second conductive regions made of a metal (i.e. tungsten) are formed by replacing the regions of a semiconductor layer in which the first and second conductive regions are to be formed by the metal. This replacement is made using the CVD method.

The transistor device and its manufacturing method of Example 3 are described.

[Step-200]

The insulating layer 81 is formed on one side of the semiconductor 90. This step can be performed in the same manner as in [Step-100] of Example 2 and its detailed description is omitted here.

[Step-210]

The gate electrode region 101, source region 106 and drain region 107, and gate side walls 104 are formed in the same manner as in [Step-110], [Step-120] and [Step-130] of Example 2. The detailed description of these steps is omitted.

[Step-220] Formation of First and Second Conductive Regions

Then a first conductive region 111 made of a metal is formed at the outer side of the source region 106 of the semiconductor layer 90 and a second conductive region 112 made of a metal is formed at the outer side of the drain region 17 of the semiconductor layer 90. This step differs from that of Example 2 as described hereinbelow.

In Example 3, the regions of the semiconductor layer to be formed with the first and second conductive regions are substituted with a metal (i.e. tungsten) by the CVD method.

More particularly, a tungsten layer is formed on an exposed region or regions of the semiconductor layer 90 between the source region 106 and the groove 80 and also on an exposed regions or region of the semiconductor layer 90 between the drain region 107 and the groove 80 according to a selective tungsten CVD method. The tungsten and is grown up while reducing $WF_6$ with the underlying semiconductor layer 90 made of silicon. By this, the semiconductor layer 90 is substituted with tungsten, the conditions used in the selective tungsten CVD method are indicated below—

Gases used: $WF_6/H_2/Ar$=10/1000/25 sccm

Temperature: 260° C.

Pressure 27 Pa.

Film thickness: 0.15 μm

Thus, a transistor device having such a structure as shown in FIG. 2 is made.

Then, the layer insulating layer and openings are formed along with subsequent formation of an interconnection layer. These steps may be carried out in the same manner as in [Step-150] and [Step-160] of Example 2 and are not described in detail here.

The fourth example of the invention is then described.

The structure of a transistor device of Example 4 is fundamentally the same as that of Example 1 shown in FIG. 2. In Example 4, the first conductive region 111 and the second conductive region 112 are respectively made of titanium silicide. In Example 4, the gate side walls 104 made of an insulating material (e.g. $SiO_2$) are also formed at the side walls of the gate electrode region 101, respectively.

The first conductive region 111 and the second conductive region 112 each made of a metal compound (i.e. titanium silicide, $TiSi_2$) are, respectively, formed by forming a metallic layer (i.e. titanium, Ti) on one side of the semiconductor layer 90 on which the first and second conductive regions are to be formed, and reacting the metallic layer and the semiconductor layer (made of Si) with each other. In Example 4, the metallic layer is formed on the other side 90B of the semiconductor layer 90.

The transistor device and the method for making the same of Example 4 are described with reference to FIGS. 4A to 4I.

[Step-300] Formation of The First and Second Conductive Regions

A first conductive region 111 made of a metal compound is formed in a region of a semiconductor layer outside the region wherein a source region is to be formed and a second conductive region 112 made of a metal compound is formed in a region of the semiconductor layer 90 outside the region wherein a drain region is to be formed. The metal compound is composed of titanium silicide ($TiSi_2$).

For this purpose, in the same process as in [Step-100] of Example 1, grooves 80 are formed on one side 90A of the semiconductor layer 90 (i.e. on one side 70A of a first semiconductor substrate 70).

An insulating material made of $SiO_2$ is deposited on the one side 70A of the first semiconductor substrate 70, including the grooves 80 according to a bias ECR CVD method. The deposition conditions of the insulating material are indicated below, Gases used: $SiH_4/N_2O/Ar$=14/35/72 sccm Temperature: 400° C.

Pressure: 0.093 Pa

Microwave power: 1000 W

Film thickness: 0.4 μm

Figure 4A:
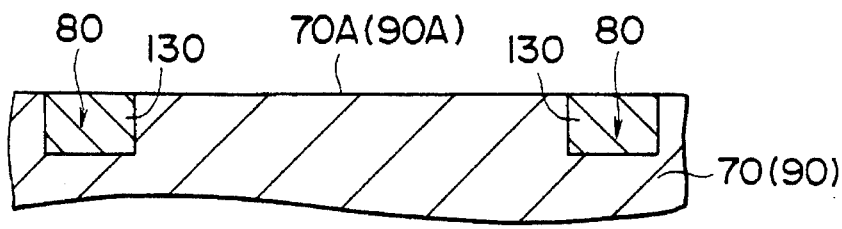
FIGS. 4A to 4I are, respectively, schematic views, partially in section, of a series of steps for illustrating a method for making a MOS transistor using an SOI technique according to a fourth embodiment of the invention.

The deposited layer is subjected to a flattening treatment to permit the insulating material 130 alone to be left in the individual grooves 80 (FIG. 4A).

After formation of a metallic layer 110 on the one side 90A of the semiconductor layer 90 (i.e. the one side 70A of the first semiconductor layer 70), the metallic layer 110 is patterned to leave a metallic layer pattern on the one side 90A of the semiconductor layer 90 on which the first and second conductive layers are to be formed, followed by reaction between the metallic layer 110 and the semiconductor layer 90. The metallic layer 110 is made of titanium and the first and second conductive regions 111, 112 are each made of titanium silicide ($TiSi_2$).

Figure 4B:
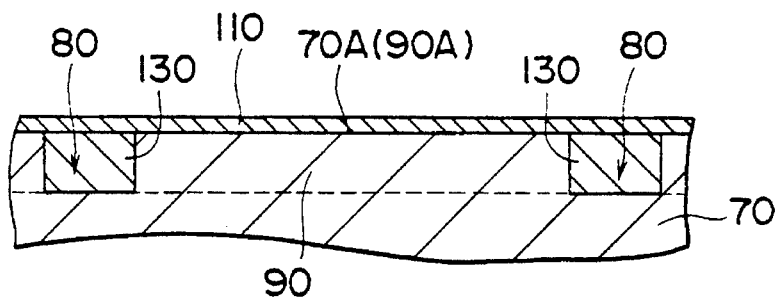
Figure 4C:
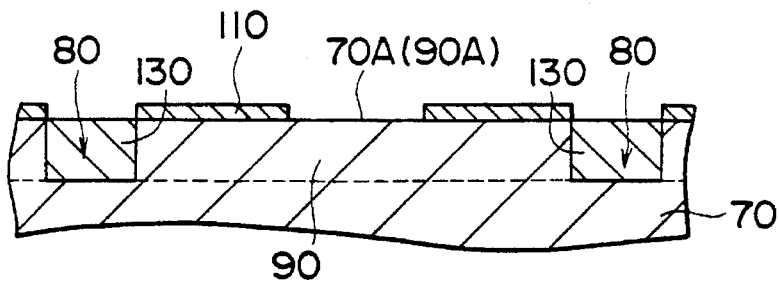

More particularly, the metallic layer 110 made of titanium is deposited on the entire surface of the one side 90A of the semiconductor layer 90 by sputtering (FIG. 4B). The thickness of the metallic layer 110 is one which is necessary for full reaction with the intended region of the semiconductor layer 90 made of silicon in a given thickness. For instance, the film-forming conditions of the metallic layer made of Ti with a thickness, for example, of 80 nm are indicated below. In FIGS. 4B and 4C, the semiconductor layer 90 is depicted as roughly shaded—

Gas used: Ar=100 sccm

Temperature: 150° C.

Pressure: 0.47 Pa.

DC power: 4 kW

The metallic layer composed of Ti is patterned to leave a metallic pattern layer on the one side 90A of the semiconductor layer 90 on which the first and second conductive regions are to be formed (FIG. 4C). The dry etching conditions of the metallic layer 110 are those, for example, shown below—

Gases used: $BCl_3/Cl_2$=60/90 sccm

Pressure: 0.016 Pa.

Microwave power: 1000 W

RF power; 50 W

Figure 4D:
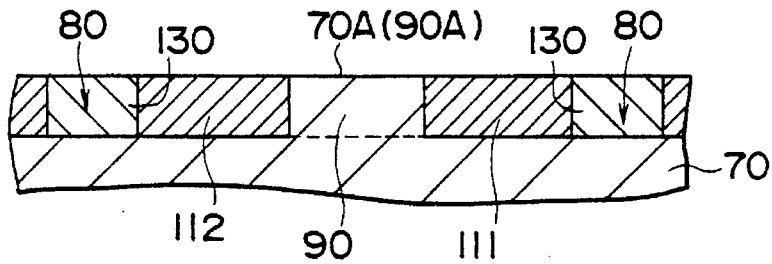

The metallic layer 110 in the form of a pattern and the semiconductor layer 90 are reacted to form a metal compound (i.e. titanium silicide, $TiSi_2$). The regions of the semiconductor layer 90 reacting with the metallic layer 110 include each region sandwiched between the source region-forming region and the groove 80 and each region between the drain region-forming region and the groove 80. In these regions, the first and second conductive regions 111, 112 are formed (FIG. 4D). The reaction between the metallic layer 110 and the semiconductor layer 90 is feasible in the same manner as in [Step-140] of Example 2 and is not described here.

[Step-310] Formation of Insulating Layer

Figure 4E:
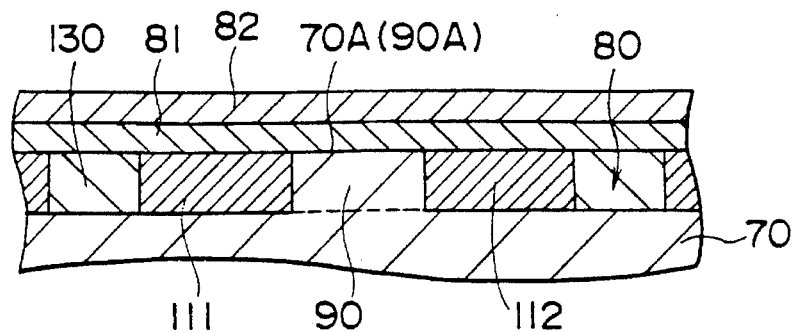

Then, the insulating layer 81 is formed on the one side 90A of the semiconductor 90. More particularly, an insulating layer 81 made of $SiO_2$ is deposited on the one side 90A of the semiconductor layer 90 by a CVD method, followed by further deposition of a polysilicon layer 82 on the insulating layer by a LP-CVD method. The deposition conditions of the insulating layer 81 and the polysilicon layer 82 are substantially the same as those used in [Step-100] of Example 2. The polysilicon layer 82 is smoothed in the same manner as in [Step-100] of Example 2 (FIG. 4E).

Figure 4F:
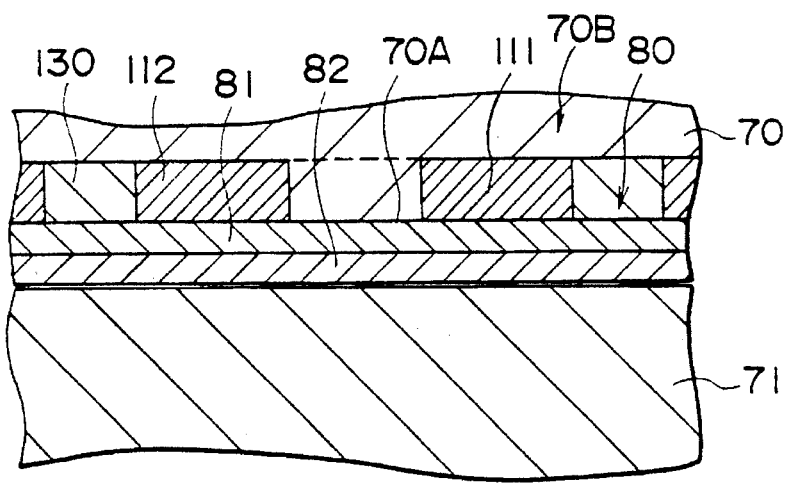
Figure 4G:
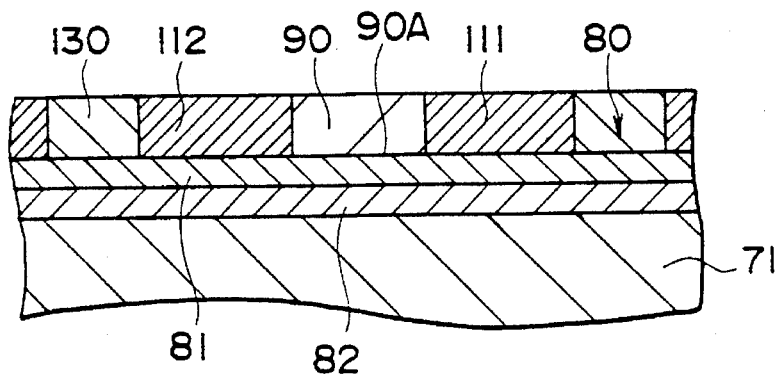
Figure 4H:
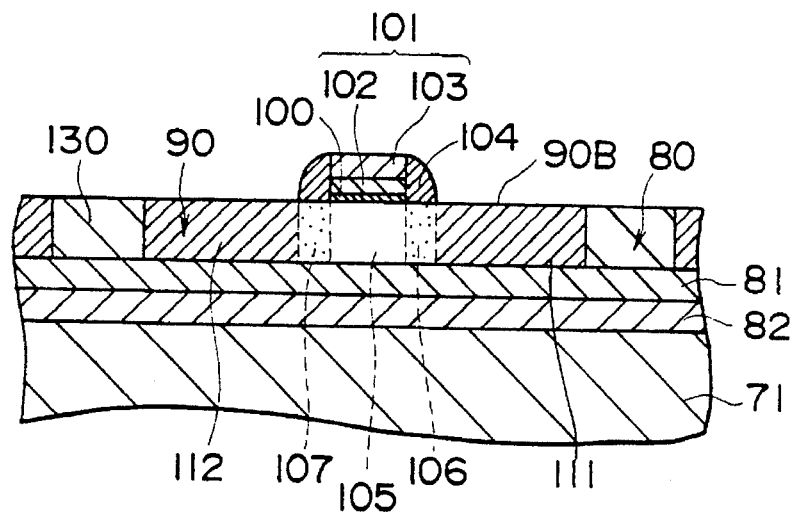

The polysilicon layer 82 is polished on the surface thereof and the polished surface of the polysilicon layer 82 and a second semiconductor substrate 71 are bonded together (FIG. 4F). The bonding can be carried out by subjecting the first and second semiconductor substrate 70, 71 in superimposed condition to thermal treatment, for example, under conditions of 1100° C.×30 minutes. Subsequently, the first semiconductor substrate 70 is polished from the opposite side 70B of the first semiconductor substrate 70 until the semiconductor layer 90 made of silicon (i.e. the silicon of the first semiconductor substrate 70) is exposed between any adjacent grooves 80 (FIG. 4G). Thus, the insulating layer 81 is formed on the one side 90A of the semiconductor layer 90 to provide a substrate having an SOI structure. The semiconductor layer 90 of the substrate has the first and second conductive regions 111, 112.

It will be noted that when the first semiconductor substrate 70 is polished from the opposite side 70B of the first semiconductor substrate 70, the first and second conductive regions 111, 112 serve as a polishing stopper, thereby reliably preventing over-polishing of the semiconductor layer 90.

[Step-320] Formation of Gate Electrode Region

In the same manner as in [Step-110] of Example 2, the gate electrode region 101 is formed on the other side 90B of the semiconductor layer 90.

[Step-330] Formation of Source and Drain Regions

Then, in the same manner as in [Step-120], the source region 106 and the drain region 107 are formed in the semiconductor layer 90, thereby forming the channel region 105 beneath the gate electrode region 101 of the semiconductor layer 90.

[Step-340] Formation of Gate Side Walls

The general procedure of [Step-130] of Example 2 is repeated to form gate side walls made of an insulating material on the side walls of the gate electrode region 102.

Figure 4I:
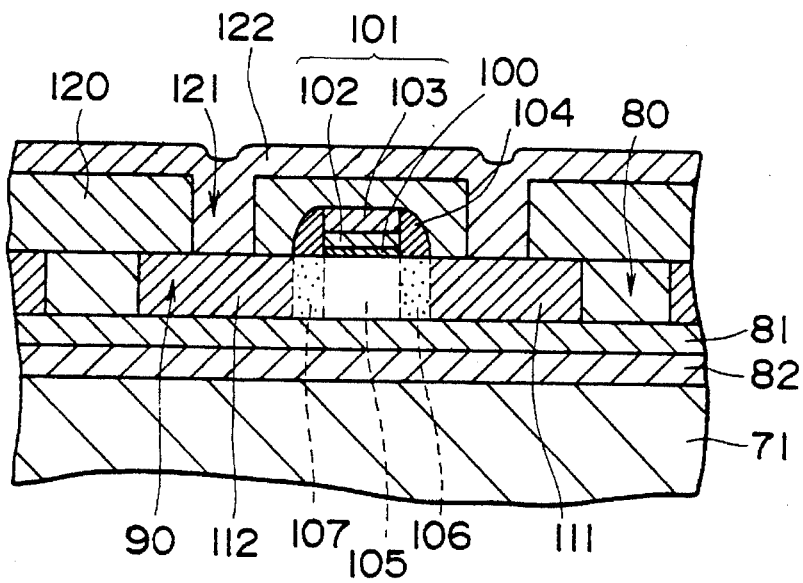

[Step-350] Formation of Layer Insulating Layer and Openings and also of Interconnection Layer Thereafter, the layer insulating layer and openings, and interconnection layers are formed (FIG. 4I). These formation steps can be carried out in the same manner as in [Step-150] and [Step-160] of Example 2.

The fifth example of the invention is then described.

In Example 4, the first and second conductive regions have been, respectively, constituted of titanium silicide. In Example 5, the first and second conductive regions are, respectively, formed of a metal (i.e. tungsten). In Example 5, the gate side walls 104 made, for example, of $SiO_2$ are formed on the side walls of the gate electrode region 101.

The transistor device of Example 5 may also be made by a method for making a transistor device according to the second embodiment of the invention as set out hereinbefore. This method comprises the step of forming gate side walls 104 made of an insulating material on the side walls of the gate electrode region 101.

The method for making a transistor device of Example 5 differs from that of Example 4 in that the first and second conductive regions made of a metal (i.e. tungsten) are formed by substitution with a metal (i.e. tungsten) in all the regions of the semiconductor layer in which the first and second conductive regions are to be formed. The substitution of the metal in all the regions of the semiconductor layer in which the first and second conductive regions are to be formed is made according to the CVD method.

With reference to FIGS. 5A to 5C, the transistor device of Example 5 and the method for making same are described.

[Step-400] Formation of the First and Second Conductive Regions

The first conductive region 111 made of a metal is formed in the regions of the semiconductor layer 90 outside the regions in which the source region is to be formed, and the second conductive region 112 made of a metal is formed in the regions of the semiconductor layer 90 outside the regions in which the drain region is to be formed. The metal is made of tungsten.

For this purpose, in the same manner as in [Step-300] of Example 4, an insulating material made of $SiO_2$ is deposited on the one side 70A of the first semiconductor substrate 70 including the grooves 80 according to the bias ECR CVD method, followed by smoothing treatment to leave the insulating material 130 only in the grooves 80 (FIG. 5A).

Then, the first conductive region 111 made of a metal is formed in regions outside the regions in which the source region of the semiconductor layer 90 is to be formed. Likewise, the second conductive region made of a metal is formed in regions outside the regions in which the drain region of the semiconductor layer 90 is to be formed. The first and second conductive regions 111, 112 are formed by full substitution of the regions of the semiconductor layer in which the first and second conductive regions are to be formed, with a metal which is tungsten.

More particularly, a mask made of $SiO_2$ is formed (FIG. 5B). The mask 140 has openings corresponding to the regions of the semiconductor layer 90 in which the first and second conductive regions are to be formed. According to the selective tungsten CVD method, a tungsten layer is formed on the exposed region of the semiconductor layer 90 between a region where a source region is to be formed and the groove 80 and on the exposed region of the semiconductor layer 90 between a region where a drain region is to be formed and the groove 80. More specifically, tungsten is deposited on the one side of the exposed semiconductor layer 90 at this bottom of each opening of the mask 140. At the time, tungsten is grown up while reducing $WF_6$ with the silicon of the underlying semiconductor layer 90. By this, the intended region of semiconductor layer 90 is substituted with tungsten (FIG. 5C). The conditions of the selective tungsten CVD method are substantially the same as in [Step-22] of Example 3. After the formation of the first and second conductive regions 111, 112, the mask is removed.

[Step-410]

Then, the procedures of [Step-310] (formation of an insulating layer), [Step-320] (formation of the gate electrode region), [Step-330] (formation of source and drain regions), [Step -340] (formation of gate side walls) and [Step-350] (formation of layer insulating layer and openings, and formation of interconnection layer) are repeated.

The sixth example of the invention is described.

The transistor device of Example 6 is a modification of Example 1. The transistor device of Example 6 differs from that of Example 2 in that as schematically and partially sectionally shown in FIG. 6, the thickness of the semiconductor layer 90 in which the channel region has been formed is smaller than that of the semiconductor layer 90 in which the source region 106 and the drain region 107 have been formed.

The transistor device of Example 6 and the method for making the same of Example 7 are described with reference to FIGS. 7A to 7D.

[Step-500]

Figure 7A:
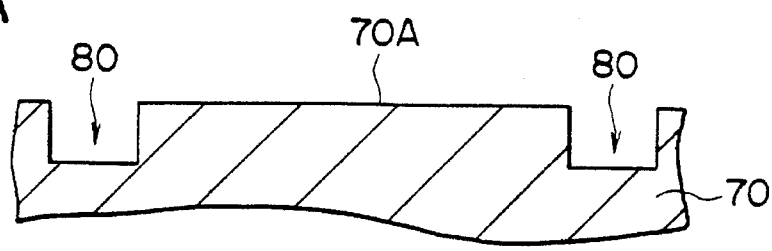
FIGS. 7A to 7D are, respectively, a schematic view, partially in section, of a series of steps of a method for making the MOS transistor shown in FIG. 6 according to a seventh embodiment of the invention.
Figure 7B:
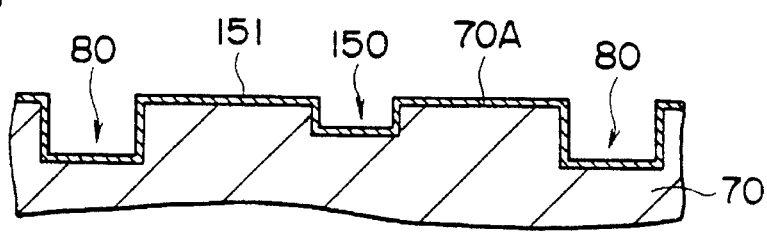

The insulating layer 81 is first formed on one side 90A of the semiconductor layer 90. In the case, the thickness of the region of the semiconductor layer 90 in which the channel region 105 is to be formed is made smaller than that of the regions of the semiconductor layer 90 in which the source region 106 and the drain region 107. More particularly, in the same manner as in [Step-100] of Example 2, grooves 80 are formed on one side 70A of the first semiconductor substrate 70 (FIG. 7A). A resist is applied onto the one side 70A of the first semiconductor substrate 70 and dried, after which the resist is patterned by use of a photolithographic technique. The first semiconductor substrate 70 is etched through the thus patterned resist to form a recess 150 with a depth of about 100 nm in a channel region-forming region of the semiconductor layer 90. The etching conditions are the same as those for forming the grooves 80. Then, the resist is removed and the semiconductor layer 90 is oxidized on the one side 90 to form an SiO$_2$ oxide film 151. Thus, there can be obtained the structure shown in FIG. 7B.

Figure 7C:
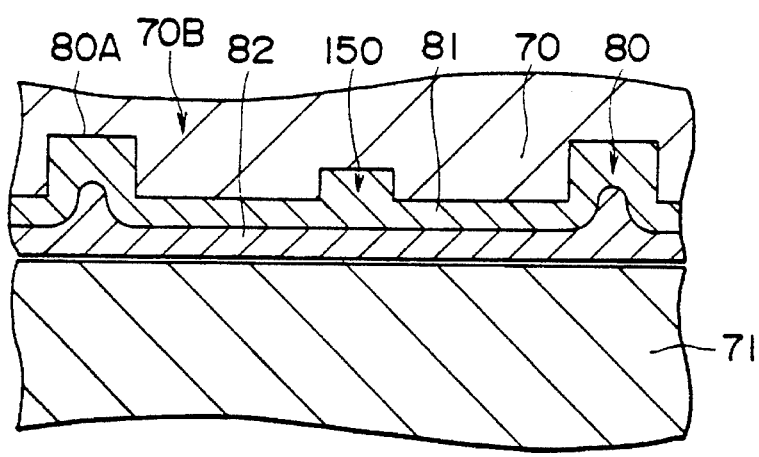
Figure 7D:
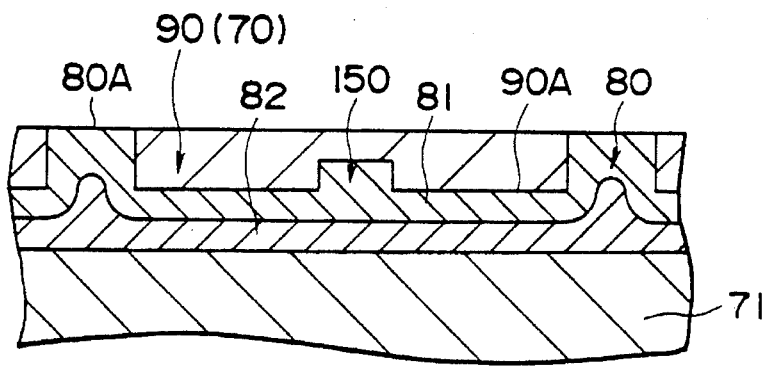

The insulating layer made of SiO$_2$ is deposited on the one side 70A of the semiconductor substrate 70 including the grooves 80 and the recess 150 according to the CVD method. Thereafter, a polysilicon layer is deposited on the insulating layer 81, followed by application of a resist on the surface of the polysilicon layer and etching back the entire surface to smooth the polysilicon layer 82. The thus smoothed polysilicon layer 82 is polished on the surface thereof and the polysilicon layer 82 is bonded on the polished surface thereof to a second semiconductor substrate 71 made of silicon (FIG. 7C). The first semiconductor substrate 70 is polished from the opposite side 70B of the first semiconductor substrate until the semiconductor layer 90 consisting of silicon (silicon constituting the first semiconductor substrate) is exposed between the adjacent grooves 80 (FIG. 7D). The above steps can be performed in the same manner as in [Step-100] of Example 2.

Figure 6:
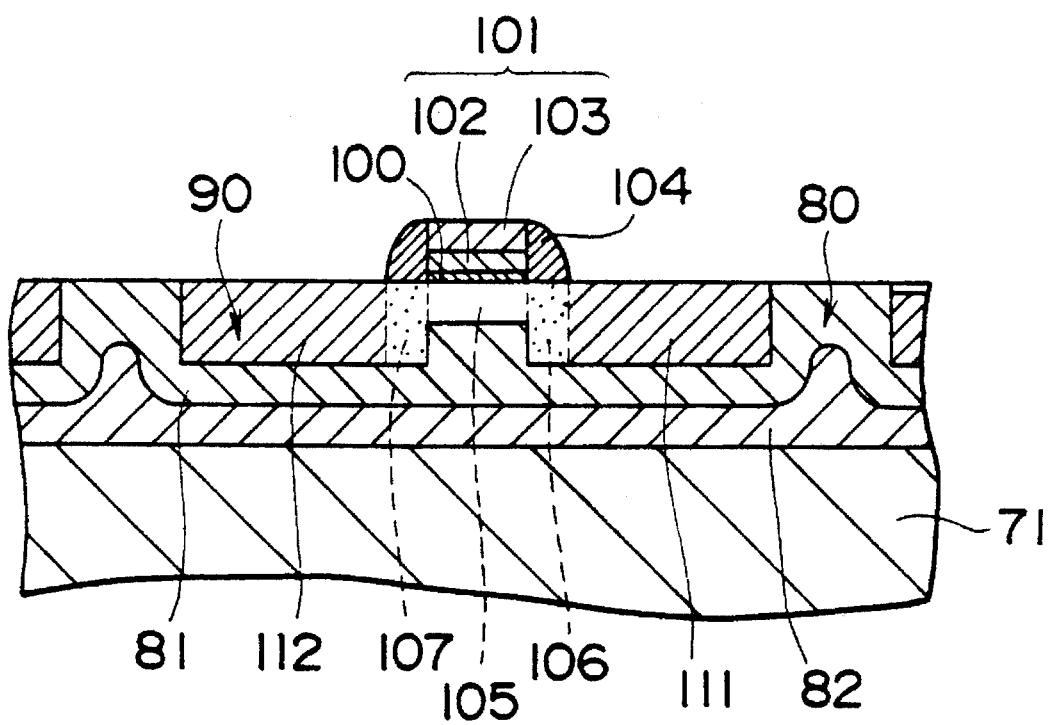
FIG. 6 is a sectional view of a structure of an SOI-type MOS transistor according to a sixth embodiment of the invention.

Through the [Step-110] (formation of gate electrode region), [Step-120] (formation of source and drain regions), [Step-130] (formation of gate side walls) and [Step-140] (formation of first and second conductive regions), there is made a MOS transistor having such a structure as shown in FIG. 6. Thereafter, the procedures of [Step-150] (formation of layer insulating layer and openings and [Step-160] (formation of interconnection layer) are performed.

The preferred embodiments of the invention have been described hereinbefore and the invention should not be construed as limiting to these embodiments. The various conditions set out in the examples are by way of example only and may be appropriately varied as desired.

Moreover, the methods for making transistor devices according to the first and second embodiments may be combined to provide a transistor device. More particularly, the procedures of [Step-300] to [Step-340] of Example 4 are first performed, followed by the procedures of [Step-140] to [Step-160]. By this, the first and second conductive regions 111, 112 can be formed reliably in the semiconductor layer 90.

The method for making a transistor device set out in Example 6 may be applied to the method set forth in Examples 3 to 5.

Further, in the examples, MOS transistor devices have been dealt with a transistor device. Other types of transistor devices may be made including bipolar transistors, TFT and the like. The metals used may further include, aside from tungsten, aluminum, copper and the like. The transition metals for the metallic layer include, aside from titanium, Co, Ni, Mo, W, Cu, Zr, Hf and the like. On the other hand, the noble metals for the metallic layer may include Pt, Au and the like. The metal compounds include, aside from silicides, TiW, TiN, TiB, WB and the like. The insulating layer may be made of any known insulating materials including, aside from SiO$_2$, BSPG, PSG, BSG, AsSG, PbSG, SbSG, SOG, SiON and SiN or may be a built-up layer of these materials. The interconnection layer set out is not limitative and may be appropriately varied. The gate side walls 104 may not be provided.

In the transistor devices of the invention, since the first and second conductive regions 111, 112 are formed at the outer sides of the source and drain regions 106, 107, the problem of degrading the breakdown voltage between the source and drain regions can be avoided. Further, the first and second conductive regions are formed, under which if the semiconductor layer is made thin, the sheet resistance of the source and drain regions can be reduced to a level of 2 to 4 orders of magnitude lower than that of known transistor devices, ensuring an improvement in response speed of the transistor device.

If the thickness of the region of the semiconductor layer 90 in which the channel region has been formed is thinner than the regions of the semiconductor layer 90 in which the source and drain regions 106, 107 have been formed, the semiconductor layer is prevented from being lost through dry etching at the time of the formation of contact holes, thereby preventing the increase of the contact resistance.

Although various minor changes and modifications might be proposed by those skilled in the art, it will be understood that our wish is to include within the claims of the patent warranted hereon all such changes and modifications as reasonably come within our contribution to the art.

What is claimed is:

1. A method for making a transistor device of a type which comprises a semiconductor layer formed on an insulating layer and having a channel region, a doped source region and a doped drain region therein, comprising the steps of:

bonding a first semiconductor substrate as said semiconductor layer with a second semiconductor substrate, said first semiconductor substrate having an insulating layer thereon at a surface thereof;

forming a gate electrode on a surface of said semiconductor layer opposite said insulating layer;

using said gate electrode as a mask along with a resist mask, thereby forming by ion implantation said doped source and drain regions at portions of said semiconductor layer in a direction laterally outwardly of said gate electrode and terminating at a distance outwardly from said gate electrode which is shorter than an overall lateral extent of said semiconductor layer both to the left and to the right so that remaining portions of said semiconductor layer outwardly of said doped source and drain regions are not effected by the ion implantation, said channel region being defined between said doped source and doped drain regions beneath said gate electrode;

forming gate side walls of an insulating material at both lateral sides of said gate electrode and substantially coincident in lateral extent with a width and lateral extent of said doped source and doped drain regions;

using said gate side walls and said gate electrode as another mask, converting said remaining portions of said semiconductor layer outwardly of said source and drain regions which have not been effected by the ion implantation to first and second conductive regions respectively lying adjacent said doped source and doped drain regions, and wherein said first and second conductive regions are made of an element selected from the group consisting of a metal and a metal compound.

2. The method according to claim 1 wherein in order to form said first and second conductive regions, a metallic layer is deposited on said side of said semiconductor layer opposite said insulating layer over at least said remaining portions of said semiconductor layer outwardly of said doped source and doped drain regions, and after said metallic layer is deposited reacting said metallic layer with the semiconductor layer to convert said remaining portions of the semiconductor layer outwardly of said doped source and doped drain regions to said first and second conductive regions.

3. The method according to claim 2 wherein said metallic layer comprises a material selected from the group consisting of a transition metal and a noble medal; and said reacting which occurs between said metallic layer and said semiconductor layer is carried out according to the steps of:

subjecting said metallic layer and said semiconductor layer to thermal treatment for reaction therebetween at a temperature at which constituent atoms of said semiconductor layer and constituent atoms of the transition metal or noble metal constituting said metallic layer are able to react, but wherein an oxide of said constituent atoms of said semiconductor layer and an oxide of the transition metal or noble metal constituting said metallic layer are unable to react; and removing an unreacted metallic layer.

4. The method according to claim 1 wherein said metal compound comprises a silicide.

5. The method according to claim 4 wherein said silicide comprises titanium silicide.

6. The method according to claim 1 wherein a top portion of said gate electrode at an upper surface of said gate electrode comprises a silicide layer formed by deposition, said deposition of said silicide layer occurring prior to said step of convening the remaining portions of said semiconductor layer outwardly of said source and drain regions to said first and second conductive regions.

7. A method for making a transistor device of a type which comprises a semiconductor layer formed on an insulating layer and having a channel region, a source region, and a drain region therein, comprising the steps of:

forming first and second conductive regions spaced apart from each other by a gap in said semiconductor layer and made of an element selected from the group consisting of a metal and a metal compound, said gap between said first and second conductive regions in said semiconductor layer including therein a channel region and said first and second conductive regions extending to all regions of said semiconductor layer other than said channel region;

forming said insulating layer on one side of the semiconductor layer;

bonding said semiconductor layer with another semiconductor layer at a side of the semiconductor layer where the insulating layer is located;

forming a gate electrode on a side of said semiconductor layer opposite said insulating layer above said gap between said first and second conductive regions where said channel region is located;

forming said source and drain regions in said semiconductor layer by ion implantation using said gate electrode and a resist mask, said source and drain regions which are ion implanted extending laterally outwardly from said channel region and terminating where said first and second conductive regions begin which is at a distance less than an overall lateral extent of said semiconductor layer so that said first and second conductive regions lie outwardly of said source and drain regions and are unaffected by said ion implantation; and forming gate side walls laterally outwardly of said gate electrode and substantially over said first and second source and drain regions.

8. The method according to claim 7 wherein in order to form said conductive regions, two spaced apart metallic layers are deposited on said side of said semiconductor layer opposite said insulating layer, and after said metallic layers are deposited reacting said metallic layers with the semiconductor layer to convert portions of the semiconductor layer which lie outwardly of said doped source and drain regions to said first and second conducting regions after said source and drain regions have been formed.

9. The method according to claim 8 wherein said metallic layers comprise a material selected from the group consisting of a transition metal and a noble medal; and said reacting between said metallic layers and said semiconductor layer is carried out according to the steps of:

subjecting said metallic layers and said semiconductor layer to thermal treatment for reaction therebetween at a temperature at which constituent atoms of said semiconductor layer and constituent atoms of the transition metal or noble metal constituting said metallic layers are able to react, but wherein an oxide of said constituent atoms of said semiconductor layer and an oxide of the transition metal or noble metal constituting said metallic layers are unable to react; and removing unreacted metallic layers.

10. The method according to claim 7 wherein said metal compound comprises a silicide.

11. The method according to claim 7 wherein said silicide comprises titanium silicide.

* * * * *